US012796504B2

(12) United States Patent
Chae et al.

(10) Patent No.: US 12,796,504 B2
(45) Date of Patent: Nov. 10, 2026

(54) SEMICONDUCTOR PACKAGE

(71) Applicant: SAMSUNG ELECTRONICS CO., LTD., Suwon-si (KR)

(72) Inventors: Jin Won Chae, Suwon-si (KR); Moon Gil Jung, Suwon-si (KR); Kwang-Bae Kim, Suwon-si (KR); So Yoen Park, Suwon-si (KR); Hyung Jun Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 393 days.

(21) Appl. No.: 18/361,482

(22) Filed: Jul. 28, 2023

(65) Prior Publication Data

US 2024/0071896 A1 Feb. 29, 2024

(30) Foreign Application Priority Data

Aug. 29, 2022 (KR) ........................ 10-2022-0108062

(51) Int. Cl.
*H10W 70/65* (2026.01)
*H10W 70/05* (2026.01)
(Continued)

(52) U.S. Cl.
CPC ........... *H10W 70/65* (2026.01); *H10W 70/05* (2026.01); *H10W 74/117* (2026.01);
(Continued)

(58) Field of Classification Search
CPC ........... H01L 23/49838; H01L 21/4857; H01L 23/3128; H01L 24/20; H01L 25/105; H01L 23/49822; H01L 24/13; H01L 24/16; H01L 24/48; H01L 2224/13111; H01L 2224/13139; H01L 2224/13147; H01L 2224/16227; H01L 2224/2105;
(Continued)

(56) References Cited

U.S. PATENT DOCUMENTS 8,981,559 B2 3/2015 Hsu et al.
9,048,222 B2 6/2015 Hung et al.
(Continued)

FOREIGN PATENT DOCUMENTS

KR 20140053547 A 5/2014
KR 101425593 B1 8/2014
(Continued)

*Primary Examiner* — Jacob Y Choi
*Assistant Examiner* — Neil R Prasad
(74) *Attorney, Agent, or Firm* — Wolf, Greenfield & Sacks, P.C.

(57) ABSTRACT

A semiconductor package includes a redistribution substrate having a first side and an opposite second side. A plurality of redistribution patterns are in the redistribution substrate, and a semiconductor chip is on the first side of the redistribution substrate. A plurality of metal pillars are positioned around and spaced apart from a periphery of the semiconductor chip and are connected to the redistribution patterns. A plurality of solder balls are on the second side of the redistribution substrate. Each of the metal pillars includes a third side facing the first side of the redistribution substrate, and an opposite fourth side. The fourth side has a square or octagonal shape in plan view.

18 Claims, 19 Drawing Sheets

(51) Int. Cl.

| | |
|---|---|
| ***H10W 74/10*** | (2026.01) |
| ***H10W 90/00*** | (2026.01) |
| *H10W 70/60* | (2026.01) |
| *H10W 70/685* | (2026.01) |
| *H10W 72/00* | (2026.01) |
| *H10W 72/20* | (2026.01) |

(52) U.S. Cl.
CPC ............ *H10W 90/00* (2026.01); *H10W 70/60* (2026.01); *H10W 70/685* (2026.01); *H10W 72/07554* (2026.01); *H10W 72/252* (2026.01); *H10W 90/722* (2026.01); *H10W 90/724* (2026.01); *H10W 90/754* (2026.01)

(58) Field of Classification Search
CPC ..... H01L 2224/211; H01L 2224/48091; H01L 2224/48105; H01L 2224/48227; H01L 2225/1035; H01L 2225/1058; H01L 2924/014
See application file for complete search history.

(56) References Cited

U.S. PATENT DOCUMENTS

| | | | | |
|---|---|---|---|---|
| 9,659,851 | B2 | 5/2017 | Wang et al. | |
| 10,867,919 | B2 | 12/2020 | Tsai et al. | |
| 11,257,715 | B2 | 2/2022 | Wu et al. | |
| 11,264,333 | B2 | 3/2022 | Chen et al. | |
| 2011/0269269 | A1 | 11/2011 | Tu et al. | |
| 2012/0043542 | A1* | 2/2012 | Yanagisawa | H10D 30/6728 257/57 |
| 2016/0233343 | A1* | 8/2016 | Miyairi | H10D 30/6739 |
| 2019/0103362 | A1* | 4/2019 | Lin | H01L 23/3114 |
| 2019/0109108 | A1* | 4/2019 | Koduri | H10W 72/20 |
| 2022/0068822 | A1* | 3/2022 | Mun | H10P 72/74 |
| 2023/0129218 | A1* | 4/2023 | Ting | H10W 70/09 257/734 |

FOREIGN PATENT DOCUMENTS

| | | | |
|---|---|---|---|
| KR | 20150018944 | A | 2/2015 |
| KR | 101502428 | B1 | 3/2015 |
| KR | 10-2020-0102741 | A | 9/2020 |
| KR | 10-2022-0015907 | A | 2/2022 |

* cited by examiner

SEMICONDUCTOR PACKAGE

CROSS-REFERENCE TO RELATED APPLICATION

This application claims priority under 35 U.S.C. § 119 to Korean Patent Application No. 10-2022-0108062 filed on Aug. 29, 2022 in the Korean Intellectual Property Office, the disclosure of which is incorporated herein by reference in its entirety.

BACKGROUND

1. Field of the Disclosure

The present disclosure relates to semiconductor packages and, more specifically, to semiconductor packages with metal pillars.

2. Description of the Related Art

The semiconductor package is an implementation of an integrated circuit chip in a form suitable for use in an electronic product. In semiconductor packages, a semiconductor chip is mounted on a printed circuit board, and they are electrically connected using a bonding wire or a bump. There is increasing demand for semiconductor packages with reduced size.

In addition, a height of metal pillars utilized in semiconductor packages may be constrained due to the physical properties of photoresist layers in a liquid state. Further, as the height of a metal pillar is increased, an increased amount of processing may be required.

SUMMARY

Aspects of the present disclosure provide semiconductor packages capable of improving performance and reliability of a product.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of the present disclosure, there is provided a semiconductor package comprising, a redistribution substrate which includes a first side and an opposite second side. A plurality of redistribution patterns are in the redistribution substrate, and a semiconductor chip is on the first side of the redistribution substrate. A plurality of metal pillars are positioned around the semiconductor chip and are connected to the plurality of redistribution patterns. A plurality of solder balls are on the second side of the redistribution substrate. Each of the plurality of metal pillars includes a third side facing the first side of the redistribution substrate, and an opposite fourth side. The fourth side has a square or octagonal shape in plan view.

According to another aspect of the present disclosure, there is provided a semiconductor package comprising, a redistribution substrate having a first side and an opposite second side. A plurality of redistribution patterns are in the redistribution substrate, and a semiconductor chip is on the first side of the redistribution substrate. A plurality of metal pillars are positioned adjacent to a side surface of the semiconductor chip and are connected to the plurality of redistribution patterns. A plurality of solder balls are on the second side of the redistribution substrate. Each of the plurality of metal pillars includes a first portion, and a second portion on the first portion. The first portion of each metal pillar has a cylindrical shape in plan view, and the second portion of each metal pillar has a square pillar shape in plan view.

According to another aspect of the present disclosure, there is provided a semiconductor package comprising, a redistribution substrate which includes a first side and an opposite second side. A plurality of redistribution patterns are in the redistribution substrate and extend in a first direction. A plurality of redistribution vias are connected to the plurality of redistribution patterns and extend toward the second side from a lower side of the plurality of redistribution patterns in a second direction transverse to the first direction. A semiconductor chip is on the first side of the redistribution substrate, and a plurality of metal pillars are positioned adjacent to a side surface of the semiconductor chip. The plurality of metal pillars are connected to the plurality of redistribution patterns. Each of the metal pillars includes a first portion, and a second portion on the first portion. A plurality of solder balls are on the second side of the redistribution substrate. The first part of each metal pillar has a circular cross-section in plan view, and the second part of each metal pillar has a square or octagonal cross-section in plan view. A side wall of the first portion of each metal pillar includes protrusions, and a side wall of the second portion of each metal pillar has a flat surface. A width of the first portion of each metal pillar is different from a width of the second portion of each metal pillar, and a height of the first portion of each metal pillar is greater than a height of the second portion of each metal pillar.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

A semiconductor package according to an embodiment will be described below with reference to FIGS. 1 to 4.

Figure 1:
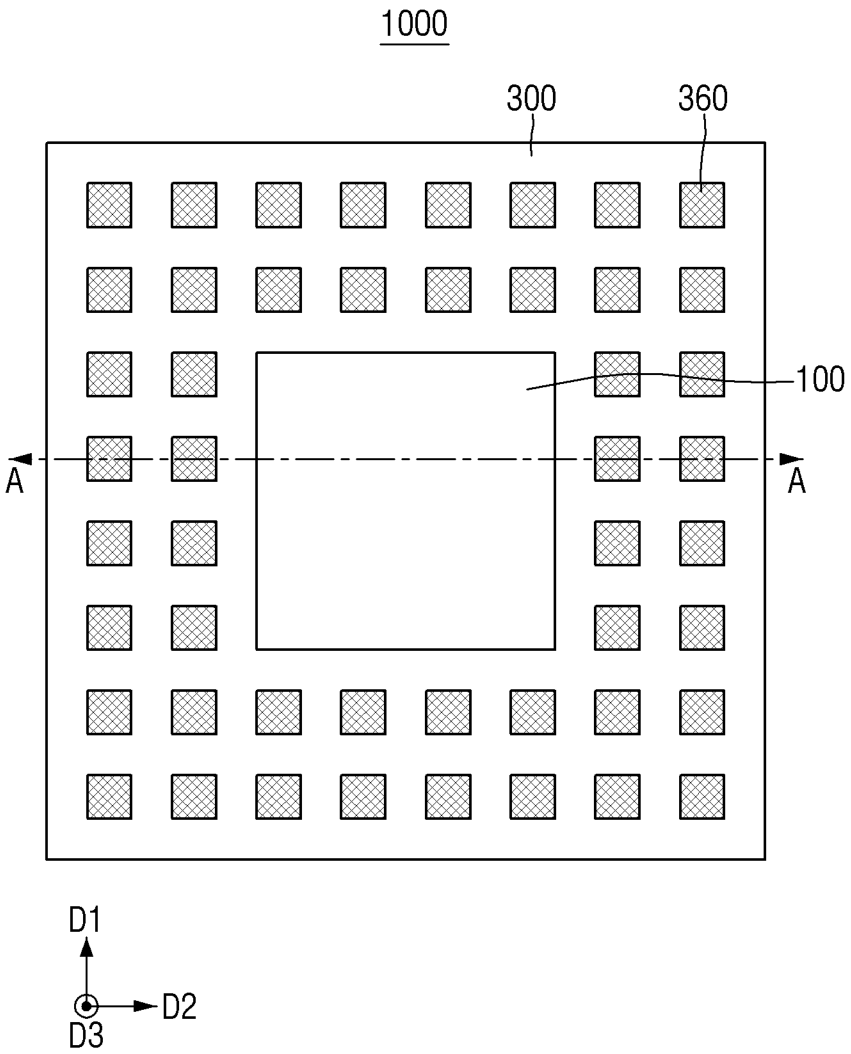
FIG. 1 is an exemplary plan view of a semiconductor package according to some embodiments.
Figure 2:
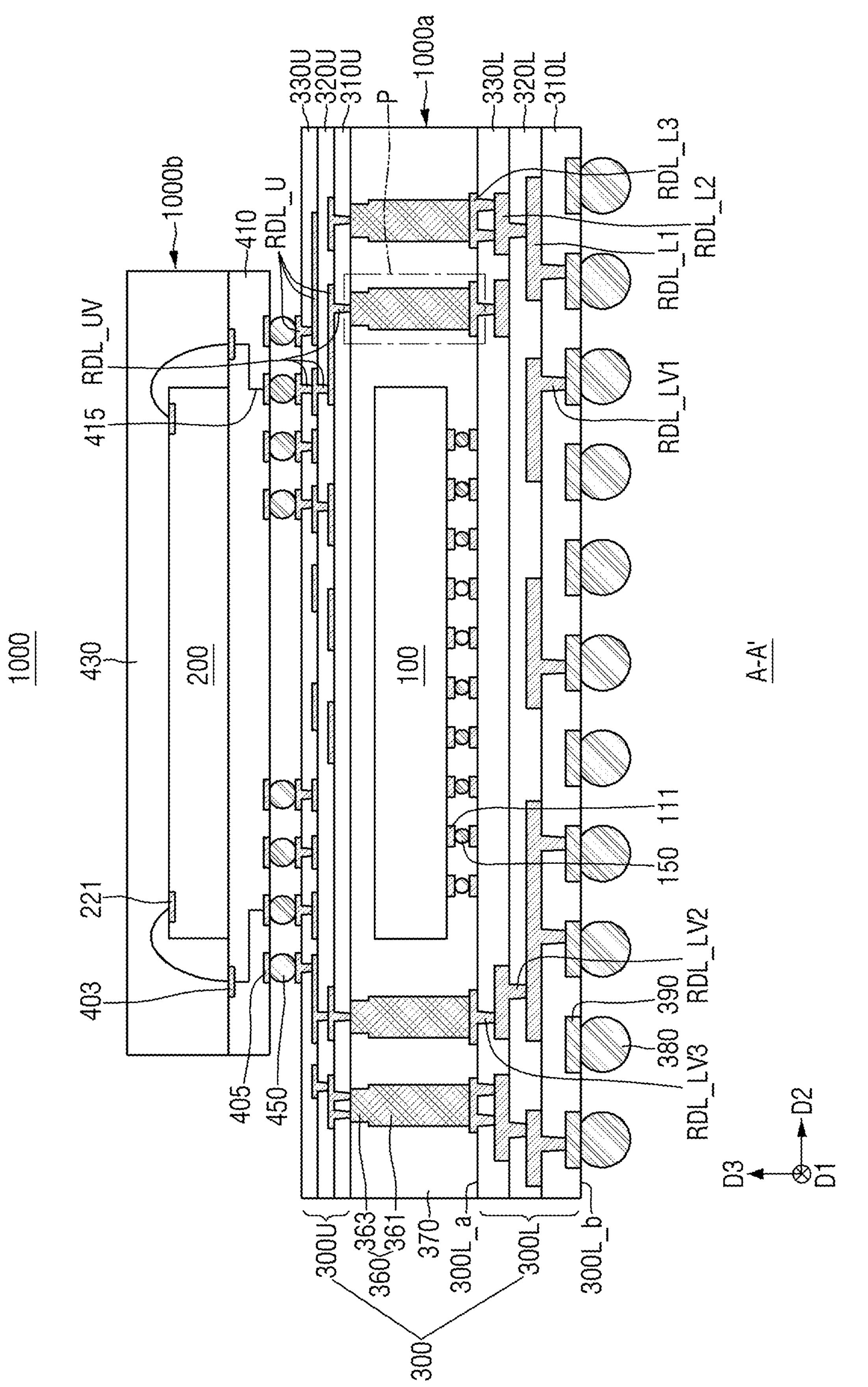
FIG. 2 is an exemplary cross-sectional view taken along a line A-A of FIG. 1.

FIG. 1 is an exemplary plan view for explaining a semiconductor package according to some embodiments. FIG. 2 is an exemplary cross-sectional view taken along a line A-A of FIG. 1.

First, referring to FIGS. 1 and 2, a semiconductor package 1000 according to some embodiments may include a first semiconductor package 1000*a*, and a second semiconductor package 1000*b* provided on the first semiconductor package 1000*a*.

The first semiconductor package 1000*a* may include a redistribution substrate 300, a first semiconductor chip 100, a plurality of metal pillars 360, a plurality of ball pads 390, a plurality of solder balls 380, a plurality of lower redistribution patterns RDL_L1, RDL_L2 and RDL_L3, and a plurality of lower redistribution vias RDL_LV1, RDL_LV2 and RDL_LV3. The plurality of metal pillars 360 may surround (i.e., are positioned around and spaced apart from) the periphery of the first semiconductor chip 100 in a flat surface extending in the first direction D1 and the second direction D2, but is not limited thereto. In the present description, the first direction D1, the second direction D2 and the third direction D3 may be substantially perpendicular to each other.

The redistribution substrate 300 may include a lower redistribution substrate 300L and an upper redistribution substrate 300U. The lower redistribution substrate 300L may be placed below the first semiconductor chip 100. The upper redistribution substrate 300U may be placed above the first semiconductor chip 100.

For example, the lower redistribution substrate 300L may include a first side 300L_a and a second side 300L_b that are opposite to each other. The upper redistribution substrate 300U and the first semiconductor chip 100 may be placed on the first side 300L_a of the lower redistribution substrate 300L. A plurality of solder balls 380 may be placed on the second side 300L_b of the lower redistribution substrate 300L. The first side 300L_a may face the first semiconductor chip 100. The second side 300L_b may face the solder balls 380.

In FIG. 2, the lower redistribution substrate 300L may include first to third lower insulating layers 310L, 320L, and 330L. The first to third lower redistribution patterns RDL_L1, RDL_L2 and RDL_L3, the first to third lower redistribution vias RDL_LV1, RDL_LV2, and RDL_LV3, and a plurality of ball pads 390 may be placed inside the first to third lower insulating layers 310L, 320L and 330L.

As an example, the first lower insulating layer 310L may wrap (e.g., encapsulate or extend around) the ball pad 390. The ball pad 390 may be exposed on one side of the first lower insulating layer 310L. The ball pad 390 may be exposed at the second side 300L_b of the lower redistribution substrate 300L. The first lower insulating layer 310L may wrap the first lower redistribution via RDL_LV1. The second lower insulating layer 320L may wrap the first lower redistribution pattern RDL_L1. Also, the second lower insulating layer 320L may wrap the second lower redistribution via RDL_LV2. The third lower insulating layer 330L may wrap the second lower redistribution pattern RDL_L2. The third lower insulating layer 330L may wrap the third lower redistribution via RDL_LV3. However, the technical idea of the present disclosure is not limited thereto. The third lower redistribution pattern RDL_L3 may be placed on the third lower insulating layer 330L, but is not limited thereto.

Each of the first to third lower insulating layers 310L, 320L, and 330L may be made of a photoimageable dielectric. For example, the first to third lower insulating layers 310L, 320L and 330L may include a photosensitive polymer. The photosensitive polymer may be formed of, for example, at least one of photosensitive polyimide, polybenzoxazole, phenolic polymers, and benzocyclobutene-based polymer. As another example, the first to third lower insulating layers 310L, 320L and 330L may be formed of silicon oxide film, silicon nitride film or silicon oxynitride film.

In some embodiments, the first to third lower redistribution vias RDL_LV1, RDL_LV2, and RDL_LV3 may each extend from the first to third lower redistribution patterns RDL_L1, RDL_L2, and RDL_L3 toward the second side 300L_b in the third direction D3. For example, the first lower redistribution via RDL_LV1 may extend from the lower side of the first lower redistribution pattern RDL_L1 in the third direction D3. The second lower redistribution via RDL_LV2 may extend from the lower side of the second lower redistribution pattern RDL_L2 in the third direction D3. The second lower redistribution via RDL_LV2 may extend from the upper side of the first lower redistribution pattern RDL_L1 in the third direction D3. The third lower redistribution via RDL_LV3 may extend from the lower side of the third lower redistribution pattern RDL_L3 in the third direction D3. The third lower redistribution via RDL_LV3 may extend from the upper side of the second lower redistribution pattern RDL_L2 in the third direction D3.

In some embodiments, widths of the first through third lower redistribution vias RDL_LV1, RDL_LV2 and RDL_LV3 in a horizontal direction may decrease from the first side 300L_a toward the second side 300L_b (i.e., the first through third lower redistribution vias RDL_LV1, RDL_LV2 and RDL_LV3 are tapered).

The first to third lower redistribution patterns RDL_L1, RDL_L2 and RDL_L3 and the first to third lower redistribution vias RDL_LV1, RDL_LV2 and RDL_LV3 may each include a conductive material. For example, the first to third lower redistribution patterns RDL_L1, RDL_L2, and RDL_L3 may include, but are not limited to, copper (Cu), aluminum (Al), silver (Ag), tin (Sn), gold (Au), nickel (Ni), lead (Pb), titanium (Ti), or alloys thereof.

In some embodiments, the lower redistribution substrate 300L may include organics. For example, the lower redistribution substrate 300L may include pre-preg. The pre-preg is a composite fiber in which reinforcing fibers such as carbon fiber, glass fiber or aramid fiber are pre-impregnated with a thermosetting polymer binder (e.g., epoxy resin) or thermoplastic resin. In some embodiments, the lower redistribution substrate 300L may include a Copper Clad Laminate (CCL). For example, the lower redistribution substrate 300L may have a structure in which a copper laminate is stacked on a single side or both sides of a thermoset pre-preg (e.g., pre-preg of C-stage).

A plurality of ball pads 390 may be provided inside the lower redistribution substrate 300L. The plurality of ball pads 390 may be provided inside the first lower insulating layer 310L. The plurality of ball pads 390 may be exposed at the second side 300L_b of the lower redistribution substrate 300L. In some embodiments, the plurality of ball pads 390 may be connected with the solder balls 380. However, the technical idea of the present disclosure is not limited thereto.

Each of the plurality of ball pads 390 may include a conductive material. For example, the plurality of ball pads 390 may include, but are not limited to, copper (Cu), aluminum (Al), silver (Ag), tin (Sn), gold (Au), nickel (Ni), lead (Pb), titanium (Ti), or alloys thereof.

A plurality of solder balls 380 may be provided on the ball pads 390. The solder balls 380 may be connected with the ball pads 390. Although each of the plurality of solder balls 380 are shown as having a ball shape, the technical idea of the present disclosure is not limited thereto. Each of the plurality of solder balls 380 may have various shapes, such as a land, a ball, a pin and a pillar. Needless to say, the number, interval, placement, and the like of the plurality of solder balls 380 are not limited to those shown in the drawings, and may vary depending on the design. Each of the plurality of solder balls 380 may each be, but are not limited to, solder bumps including low-melting point metals, for example, tin (Sn), tin (Sn) alloy or the like.

The first semiconductor package 1000*a* according to some embodiments may further include a molding film 370, a plurality of first chip pads 111, and a plurality of second connecting members 150.

The first semiconductor chip 100 may be mounted on the first side 300L_a of the lower redistribution substrate 300L. The first semiconductor chip 100 may be placed in a central region of the lower redistribution substrate 300L, as illustrated in FIG. 2 and when viewed in plan view.

The first chip pads 111 may be provided on the lower side of the first semiconductor chip 100. The lower side of the first semiconductor chip 100 may be placed to face the first side 300L_a of the lower redistribution substrate 300L. The first chip pads 111 of the first semiconductor chip 100 may be connected to the third lower redistribution pattern RDL_L3.

The second connecting members 150 may be attached between the first chip pads 111 of the first semiconductor chip 100 and the third lower redistribution pattern RDL_L3. The first semiconductor chip 100 and the solder balls 380 may be electrically connected through the second connecting members 150. The second connecting members 150 may be, but are not limited to, solder bumps including low-melting point metals, for example, tin (Sn) and tin (Sn) alloys. The second connecting members 150 may have various shapes such as a land, a ball, a pin and a pillar. The second connecting members 150 may be formed of a single layer or multiple layers. When the second connecting members 150 are formed of a single layer, the second connecting members 150 may include tin-silver (Sn—Ag) solder or copper (Cu) as an example. When the second connecting members 150 are formed of multiple layers, the second connecting member 150 may include, for example copper (Cu) filler and solder as an example. The number, interval, placement form, and the like of the second connecting members 150 are not limited to those shown in the drawings, and may vary depending on the design.

A plurality of metal pillars 360 may be provided around the first semiconductor chip 100, as illustrated in FIG. 1. The plurality of metal pillars 360 may surround (i.e., are positioned around and spaced apart from a periphery of) the first semiconductor chip 100 when viewed in plan view. The metal pillars 360 may electrically connect the lower redistribution substrate 300L and the upper redistribution substrate 300U. The metal pillars 360 may penetrate the molding film 370. The upper side of each metal pillar 360 may be coplanar with the upper side of the molding film 370. The lower side of each metal pillar 360 may come into contact with the third lower redistribution patterns RDL_L3 of the lower redistribution substrate 300L.

In some embodiments, each of the plurality of metal pillars 360 may include a first portion 361, and a second portion 363 on the first portion 361. The second portion 363 may not overlap the first semiconductor chip 100 in the first direction D1 or the second direction D2. Unlike the shown example, the second portion 363 may overlap the first semiconductor chip 100 in the first direction D1 or the second direction D2. A detailed description of the first portion 361 and the second portion 363 will be provided below using FIGS. 3 and 4.

The plurality of metal pillars 360 may include a conductive material. The plurality of metal pillars 360 may include the same material as the third lower redistribution pattern RDL_L3. For example, the plurality of metal pillars 360 may include, but are not limited to, copper (Cu), aluminum (Al), silver (Ag), tin (Sn), gold (Au), nickel (Ni), lead (Pb), titanium (Ti), or alloys thereof.

The molding film 370 may be provided between the lower redistribution substrate 300L and the upper redistribution substrate 300U. The molding film 370 may cover the first semiconductor chip 100. The molding film 370 may be provided on the first side 300L_a of the lower redistribution substrate 300L. The molding film 370 may cover side walls and the upper side of the first semiconductor chip 100. The molding film 370 may be filled between the metal pillars 360. The thickness of the molding film 370 may be substantially the same as the thickness of the metal pillars 360. The molding film 370 may include an insulating polymer such as an epoxy-based molding compound.

The upper redistribution substrate 300U may include first to third upper insulating layers 310U, 320U, and 330U, and upper redistribution patterns RDL_U and upper redistribution vias RDL_UV inside the first to third upper insulating layers 310U, 320U, and 330U. The first to third upper insulating layers 310U, 320U and 330U may include the same material as those included in the first to third lower insulating layers 310L, 320L and 330L.

For example, the first to third upper insulating layers 310U, 320U, and 330U may each be formed of a photoimageable dielectric. The first to third upper insulating layers 310U, 320U and 330U may include a photosensitive polymer. The photosensitive polymer may be formed of, for example, at least one of photosensitive polyimide, polybenzoxazole, phenolic polymers, and benzocyclobutene-based polymer. As another example, the first to third upper insulating layers 310U, 320U and 330U may be formed of silicon oxide film, silicon nitride film or silicon oxynitride film.

The upper redistribution patterns RDL_U and the upper redistribution vias RDL_UV may include the same material as the first to third lower redistribution patterns RDL_L1, RDL_L2 and RDL_L3. For example, the upper redistribution patterns RDL_U and the upper redistribution vias RDL_UV may include, but are not limited to, copper (Cu), aluminum (Al), silver (Ag), tin (Sn), gold (Au), nickel (Ni), lead (Pb), titanium (Ti), or alloys thereof.

The second semiconductor package 1000*b* may be placed on the upper redistribution substrate 300U. The second semiconductor package 1000*b* may include a circuit board 410, a second semiconductor chip 200 and an upper molding film 430. The circuit board 410 may be, but is not limited to, a printed circuit board. The lower conductive pad 405 may be located on the lower side of the circuit board 410.

The second semiconductor chip 200 may be placed on the circuit board 410. The second semiconductor chip 200 may include integrated circuits. The integrated circuits may include a memory circuit, a logic circuit or a combination thereof. The second chip pads 221 of the second semiconductor chip 200 may be electrically connected to the upper conductive pads 403 of the upper side of the circuit board 410 by wire bonding. The upper conductive pads 403 of the upper side of the circuit board 410 may be electrically connected to the lower conductive pads 405 through the internal wiring 415 inside the circuit board 410.

An upper molding film 430 may be provided on the circuit board 410. The upper molding film 430 may cover the second semiconductor chip 200. The upper molding film 430 may include an insulating polymer such as an epoxy-based polymer.

The semiconductor package 1000 according to some embodiments may further include a plurality of third connecting members 450. The third connecting members 450 may be provided between the lower conductive pad 405 of the circuit board 410 and the upper redistribution patterns RLD_U. The third connecting members 450 may be, but are not limited to, solder bumps including low-melting point metals, for example, tin (Sn) and tin (Sn) alloys. The third connecting members 450 may have various shapes such as a land, a ball, a pin, a pillar, and the like. The third connecting members 450 may be formed of a single layer or multiple layers. When the third connecting members 450 are formed of a single layer, the third connecting members 450 may include, for example, tin-silver (Sn—Ag) solder or copper (Cu). When the third connecting members 450 are formed of multiple layers, the third connecting members 450 may include, for example, copper (Cu) filler and solder. The number, interval, placement form, and the like of the third connecting members 450 are not limited to those shown in the drawings, and may vary depending on the design.

The metal pillars 360 according to some embodiments will be described in more detail below with reference to FIGS. 3 and 4.

Figure 3:
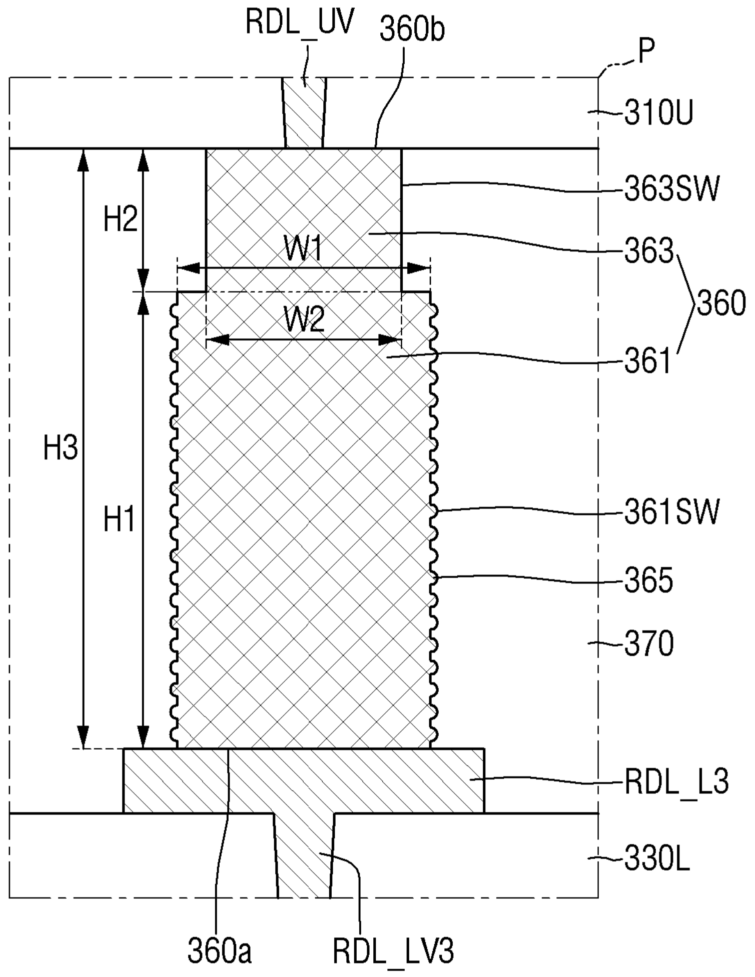
FIG. 3 is an enlarged view of a region P of FIG. 2.

FIG. 3 is an enlarged view of a region P of FIG. 2. FIG. 4 is an exemplary perspective view for explaining the metal pillar of FIG. 2.

First, referring to FIG. 3, the metal pillar 360 may include a first portion 361 and a second portion 363. The second portion 363 of the metal pillar 360 may be placed on the first portion 361. The first portion 361 of the metal pillar 360 may be connected to the third lower redistribution pattern RDL_L3. The second portion 363 of the metal pillar 360 may be connected to the upper redistribution via RDL_UV.

In some embodiments, side walls 361SW of the first portion 361 of the metal pillar 360 may include protrusions 365. The protrusions 365 may protrude (i.e., extend outwardly) from the body portion of the first portion 361 of the metal pillar 360 in a horizontal direction. The term "horizontal direction" may be the first direction D1, the second direction D2, and any direction between the first direction D1 and the second direction D2. The first portion 361 of the metal pillar 360 may be deposited through electroplating. Therefore, the protrusions 365 may be formed on the side walls 361SW of the first portion 361 of the metal pillar 360.

On the other hand, side walls 363SW of the second portion 363 of the metal pillar 360 may not include the protrusions. The side walls 363SW of the second portion 363 of the metal pillar 360 may be a flat surface. The second portion 363 of the metal pillar 360 may be formed by cutting a part of the pre-metal pillar. Accordingly, the side walls 363SW of the second portion 363 of the metal pillar 360 may be a flat surface.

In terms of cross-section, the side walls 363SW of the second portion 363 of the metal pillar 360 may extend in a vertical direction. The vertical direction may be a direction that intersects the horizontal direction, and as an example, the vertical direction may be the third direction D3.

In some embodiments, in a portion in which the first portion 361 of the metal pillar 360 abuts against the second portion 363 of the metal pillar 360, the width of the first portion 361 of the metal pillar 360 and the width of the third portion 363 of the metal pillar 360 may be different from each other.

For example, at the portion in which the first portion 361 of the metal pillar 360 abuts against the second portion 363 of the metal pillar 360, the first portion 361 of the metal pillar 360 may have a first width W1 in the horizontal direction. At the portion in which the first portion 361 of the metal pillar 360 abuts against the second portion 363 of the metal pillar 360, the second portion 363 of the metal pillar 360 may have a second width W2 in the horizontal direction. The first width W1 may be smaller than the second width W2. That is, the first portion 361 of the metal pillar 360 and the second portion 363 of the metal pillar 360 may have a step.

In some embodiments, a vertical height of the first portion 361 of the metal pillar 360 and a vertical height of the second portion 363 of the metal pillar 360 may differ from each other. The first portion 361 of the metal pillar 360 may have a first height H1 in the vertical direction. The second portion 363 of the metal pillar 360 may have a second height H2 in the vertical direction. The first height H1 may be greater than the second height H2. In an example, although a ratio between the first height H1 and the second height H2 may be 5:1, the technical idea of the present disclosure is not limited thereto.

In some embodiments, a height H3 of the metal pillar 360 in the vertical direction may be 250 μm or more and 350 μm or less. Preferably, the height H3 of the metal pillar 360 in the vertical direction may be 300 μm or more and 350 μm or less.

In some embodiments, the metal pillar 360 may include a third side 360*a* and a fourth side 360*b*. The third side 360*a* and the fourth side 360*b* may be opposite to each other. The third side 360*a* may face the first side 300L_a of the lower redistribution substrate 300L. The third side 360*a* may abut against the third lower redistribution pattern RDL_L3. The fourth side 360*b* may abut against the upper redistribution via RDL_UV. In some embodiments, the area of the third side 360*a* may be greater than the area of the fourth side 360*b*. Also, the width of the third side 360*a* may be greater than the width of the fourth side 360*b*.

Figure 4:
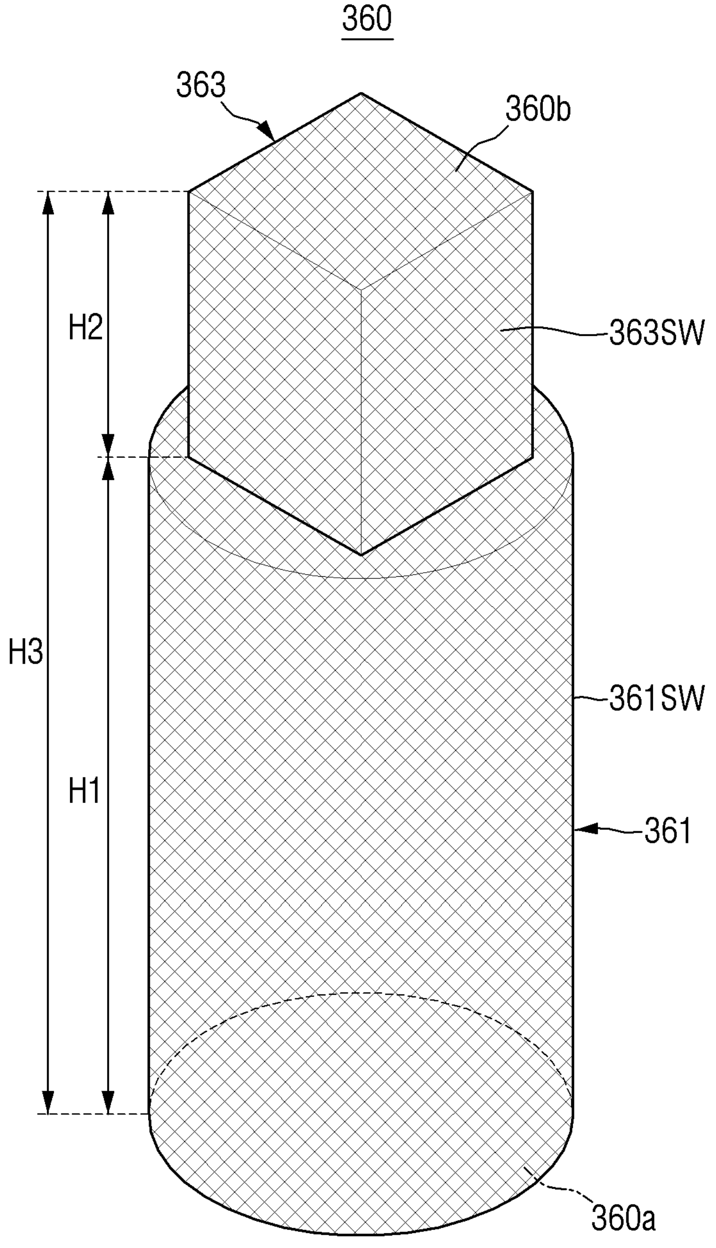
FIG. 4 is an exemplary perspective view of the metal pillar of FIG. 2.

Referring to FIG. 4, the shape of the first portion 361 of the metal pillar 360 and the shape of the second portion 363 of the metal pillar 360 may be different from each other.

For example, the first portion 361 of the metal pillar 360 may have a cylindrical shape, and the second portion 363 of the metal pillar 360 may have a square pillar shape. In plan view, the cross section of the first portion 361 of the metal pillar 360 may have a circular shape, and the second portion 363 of the metal pillar 360 may have a square shape. In plan view, the third side 360*a* of the metal pillar 360 may have a circular shape, and the fourth side 360*b* of the metal pillar 360 may have a square shape. However, the technical idea of the present disclosure is not limited thereto.

Hereinafter, a semiconductor package according to other embodiments will be described with reference to FIGS. 5 to 11.

Figure 5:
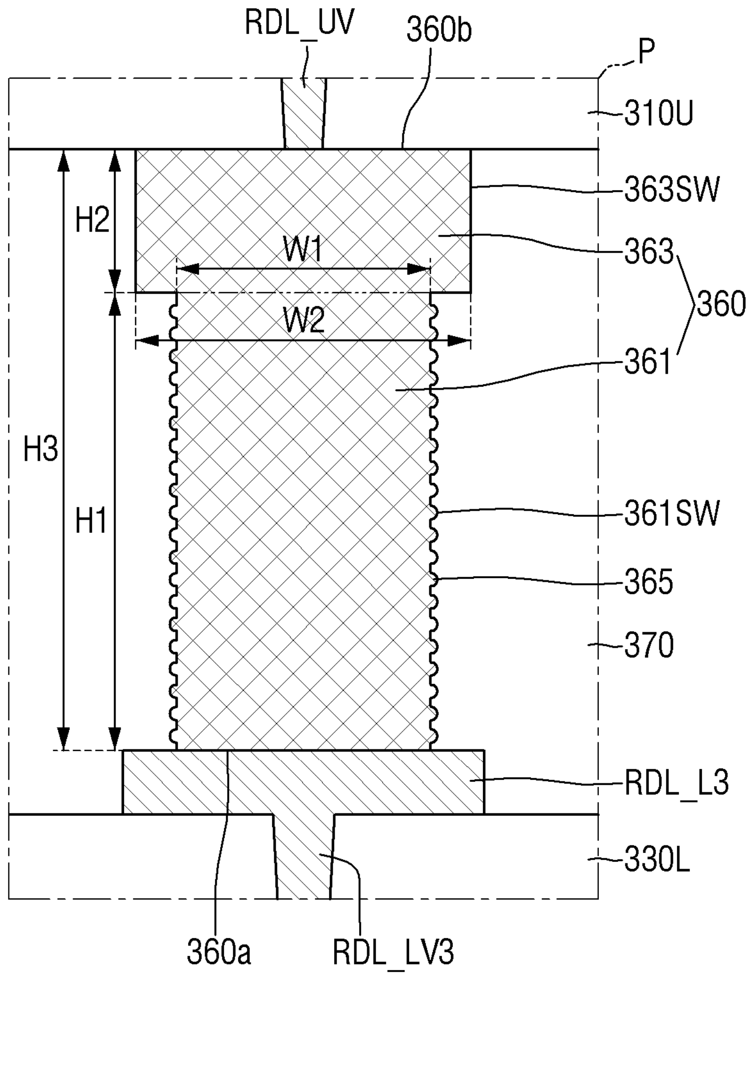
FIGS. 5 and 6 are diagrams of a metal pillar according to some embodiments.
Figure 6:
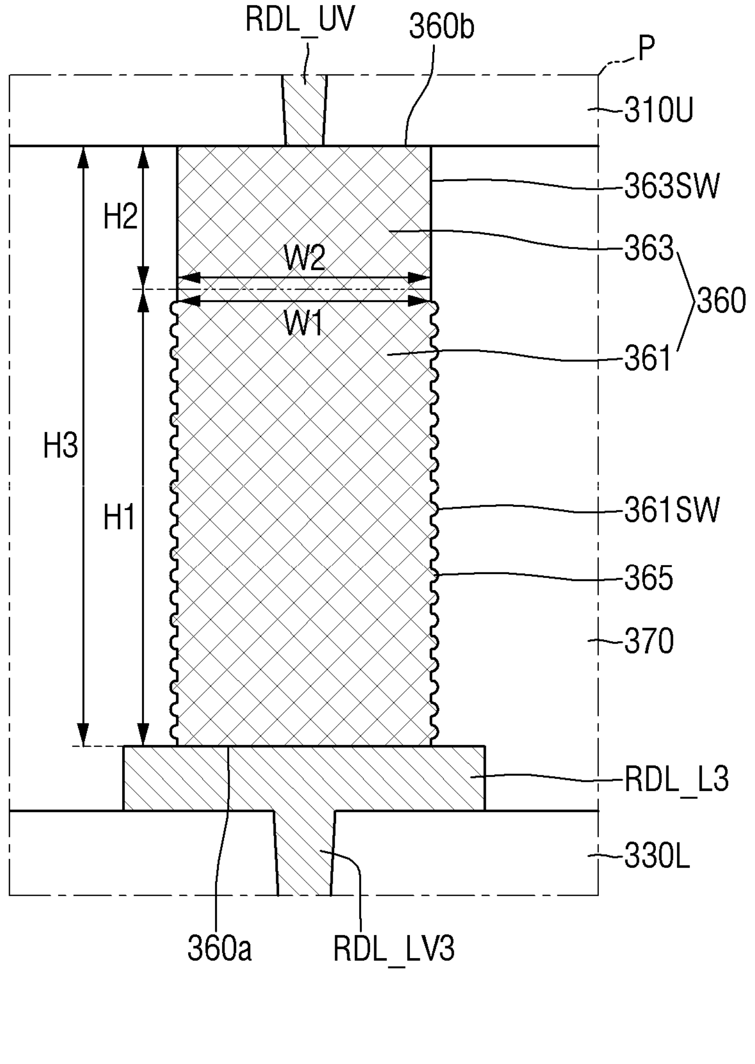

FIGS. 5 and 6 are diagrams for explaining a metal pillar according to some embodiments. For convenience of explanation, the explanation will focus on points that are different from those explained using FIGS. 1 to 4.

First, referring to FIG. 5, at the portion in which the first portion 361 of the metal pillar 360 abuts against the second portion 363 of the metal pillar 360, the first portion 361 of the metal pillar 360 may have a first width W1 in the horizontal direction. At the portion in which the first portion 361 of the metal pillar 360 abuts against the second portion 363 of the metal pillar 360, the second portion 363 of the metal pillar 360 may have a second width W2 in the horizontal direction. The first width W1 may be greater than the second width W2. That is, the second portion 363 of the metal pillar 360 may protrude beyond the first portion 361 of the metal pillar 360 in the horizontal direction. The first portion 361 of the metal pillar 360 and the second portion 363 of the metal pillar 360 may have a step.

The protrusions 365 may overlap the second portion 363 of the metal pillar 360 in the third direction D3. The protrusions 365 may overlap the fourth side 360*b* in the third direction D3.

Referring to FIG. 6, at the portion in which the first portion 361 of the metal pillar 360 abuts against the second portion 363 of the metal pillar 360, the width of the first portion 361 of the metal pillar 360 may be the same as the width of the third portion 363 of the metal pillar 360. That is, the first portion 361 of the metal pillar 360 and the second portion 363 of the metal pillar 360 do not have a step.

Specifically, at the portion in which the first portion 361 of the metal pillar 360 abuts against the second portion 363 of the metal pillar 360, the first portion 361 of the metal pillar 360 may have a first width W1 in the horizontal direction. At the portion in which the first portion 361 of the metal pillar 360 abuts against the second portion 363 of the metal pillar 360, the second portion 363 of the metal pillar 360 may have a second width W2 in the horizontal direction. The first width W1 and the second width W2 may be the same as each other.

Figure 7:
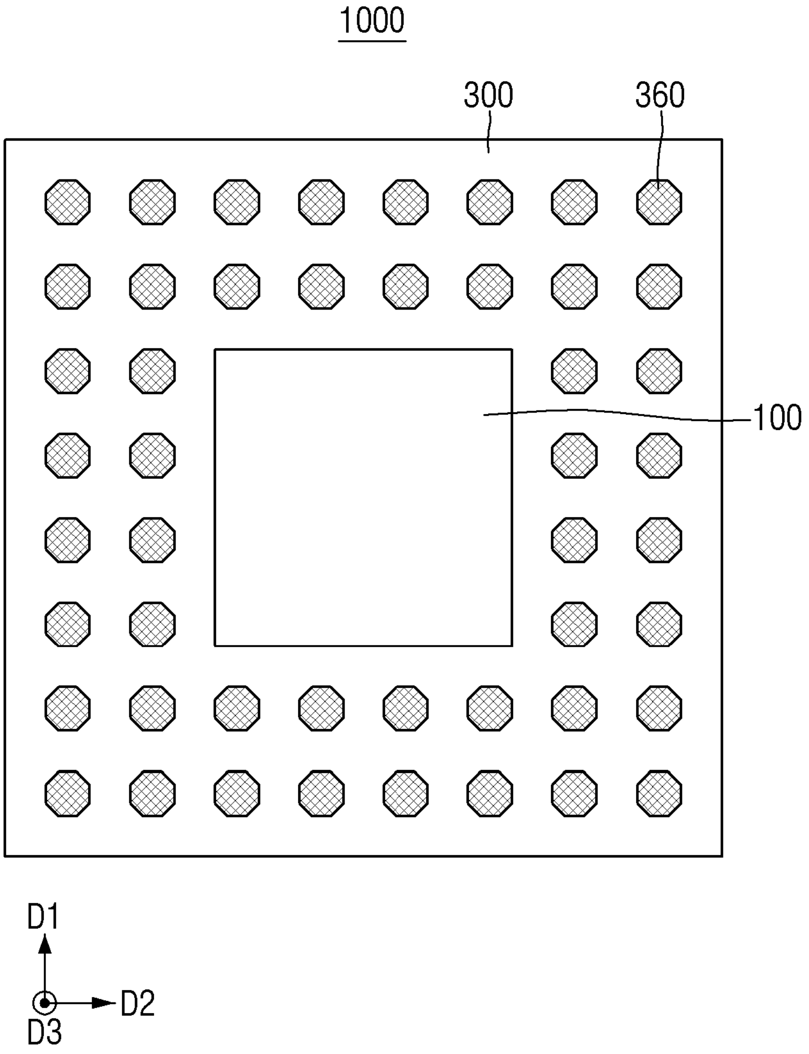
FIGS. 7 and 8 are diagrams of a semiconductor package according to some embodiments.
Figure 8:
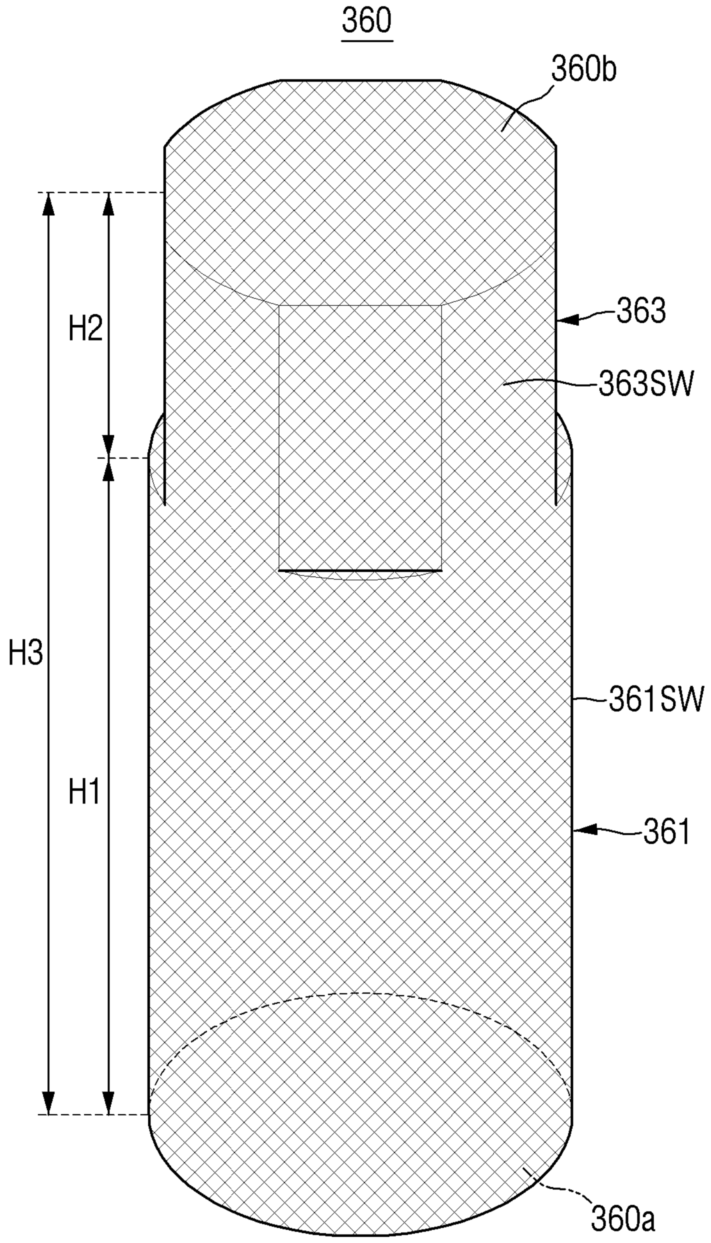

FIGS. 7 and 8 are diagrams for explaining a semiconductor package according to some embodiments. For convenience of explanation, the explanation will focus on points that are different from those explained using FIGS. 1 to 4. For reference, FIG. 8 is a perspective view for explaining the metal pillar 360 of FIG. 7.

Referring to FIGS. 7 and 8, in plan view, the fourth side 360*b* of the metal pillar 360 may have an octagonal shape.

More specifically, the second portion 363 of the metal pillar 360 may have an octagonal pillar shape. In plan view, the cross section of the second portion 363 of the metal pillar 360 may have an octagonal shape.

Figure 9:
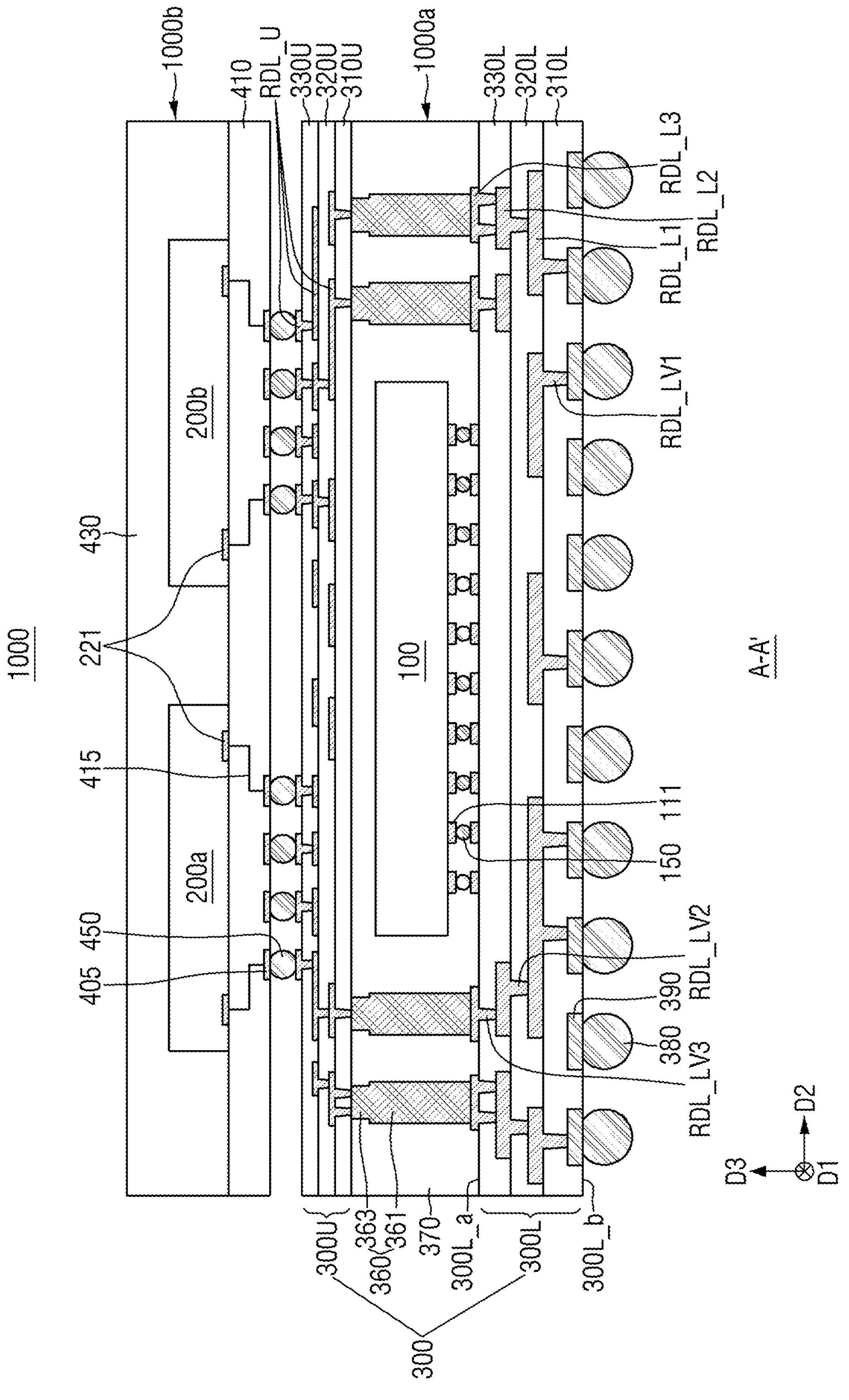
FIGS. 9 to 11 are diagrams of a semiconductor package according to some embodiments.
Figure 10:
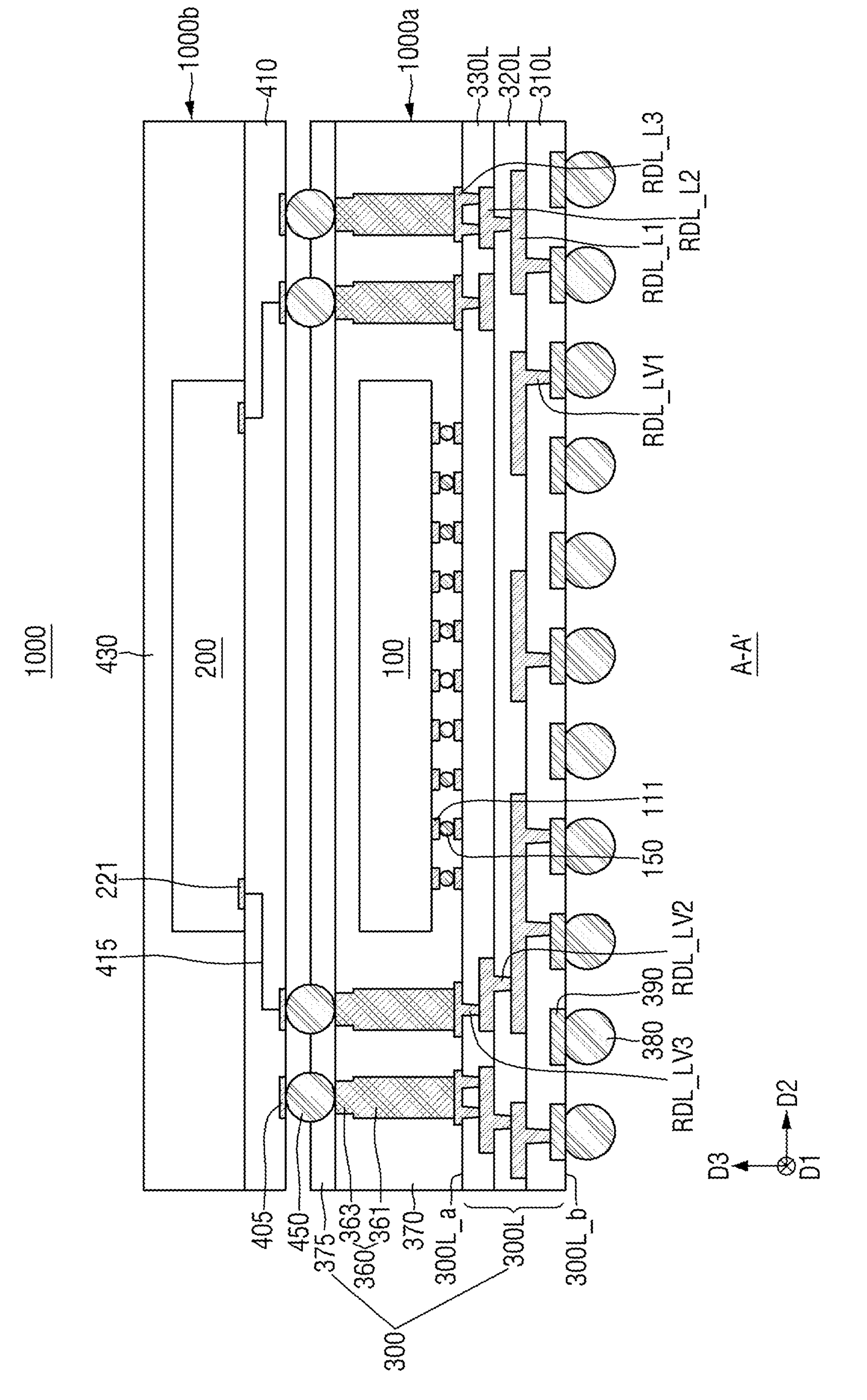
Figure 11:
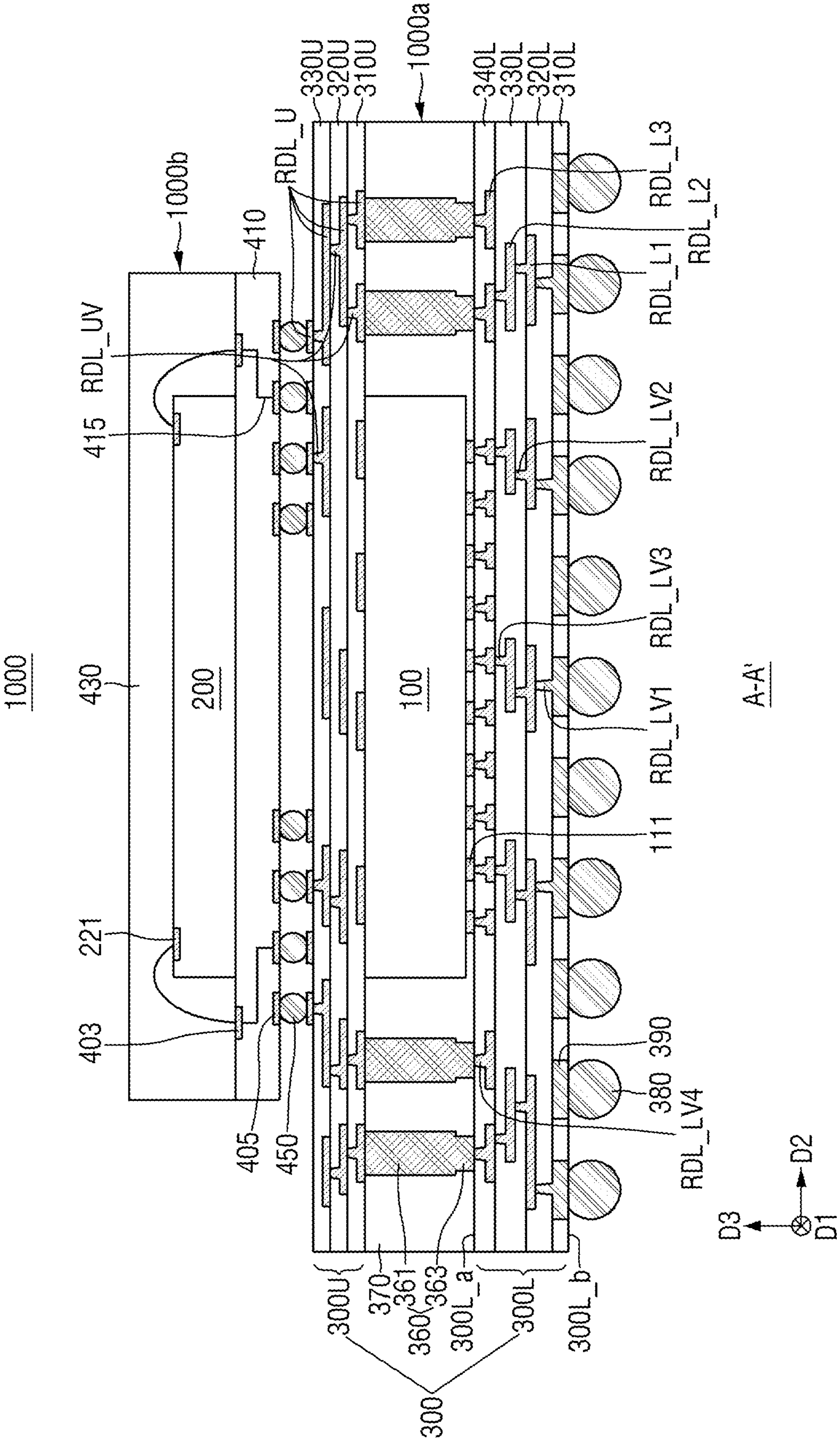

FIGS. 9 to 11 are diagrams for explaining a semiconductor package according to some embodiments. For convenience of explanation, the explanation will focus on points that are different from those explained using FIGS. 1 to 4.

First, referring to FIG. 9, the second semiconductor package 1000*b* may include two second semiconductor chips 200*a* and 200*b*. That is, the second semiconductor chip may include a first sub-semiconductor chip 200*a* and a second sub-semiconductor chip 200*b*.

The first sub-semiconductor chip 200*a* and the second sub-semiconductor chip 200*b* may be spaced apart from each other. The first sub-semiconductor chip 200*a* and the second sub-semiconductor chip 200*b* may be separated from each other by the upper molding film 430. Each of the first sub-semiconductor chip 200*a* and the second sub-semiconductor chip 200*b* may include second chip pads 221 on its lower side. The second semiconductor package 1000*b* does not include the upper conductive pad 403. As an example, the second chip pads 221 may be electrically connected to the lower conductive pads 405 through internal wirings 415 inside the circuit board 410.

Although FIG. 9 shows that the first and second sub-semiconductor chips 200*a* and 200*b* are provided at the same level on the upper side of the circuit board 410, the first sub-semiconductor chip 200*a* and the second sub-semiconductor chip 200*b* may be sequentially stacked on the upper side of the circuit board 410.

Referring to FIG. 10, unlike the embodiment shown in FIG. 2, the upper package substrate may be omitted from the first semiconductor package 1000*a*.

More specifically, an upper insulating layer 375 may be provided on the molding film 370. The upper insulating layer 375 may include an insulating material. For example, the upper insulating layer 375 may include, but is not limited to, at least one of silicon oxide, silicon nitride, silicon oxynitride, and a low dielectric constant (low-k) material having a dielectric constant lower than that of silicon oxide.

The third connecting members 450 may be provided between the lower conductive pad 405 of the circuit board 410 and the metal pillars 360 of the first semiconductor package 1000*a*. A part of the third connecting members 450 may be placed inside the upper insulating layer 375. One side of the third connecting members 450 may be connected to the lower conductive pad 405, and the other side of the third connecting members 450 may be connected to the metal pillars 360. Therefore, the first semiconductor package 1000*a* and the second semiconductor package 1000*b* may be electrically connected.

The second semiconductor chip 200 may be placed on the circuit board 410. The second chip pads 221 of the second semiconductor chip 200 may abut against the upper side of the circuit board 410. The second chip pads 221 of the second semiconductor chip 200 may be electrically connected to the lower conductive pad 405 through the internal wiring 415 inside the circuit board 410.

Referring to FIG. 11, unlike the embodiment shown in FIG. 2, a redistribution substrate 300 may be formed on the active surface of the first semiconductor chip 100.

The lower redistribution substrate 300L may be directly placed on the first chip pads 111 of the first semiconductor chip 100. The lower redistribution substrate 300L may come into contact with the first chip pads 111 of the first semiconductor chip 100. First to fourth lower insulating layers 310L, 320L and 330L, and 340L may be stacked on the first chip pads 111 of the first semiconductor chip 100. First to third lower redistribution patterns RDL_L1, RDL_L2 and RDL_L3 and first to fourth lower redistribution vias RDL_LV1, RDL_LV2, RDL_LV3 and RDL_LV4 may be placed inside the first to fourth lower insulating layers 310L, 320L, 330L and 340L.

As an example, the ball pad 390 may be provided inside the first lower insulating layer 310L. A first lower redistribution via RDL_LV1 may be provided inside the second lower insulating layer 320L. A first lower redistribution pattern RDL_L1 may be provided inside the second lower insulating layer 320L. A second lower redistribution via RDL_LV2 may be provided inside the third lower insulating layer 330L. A second lower redistribution pattern RDL_L2 may be provided inside the third lower insulating layer 330L. A third lower redistribution via RDL_LV3 may be provided inside the third lower insulating layer 330L. A third lower redistribution pattern RDL_L3 may be provided inside the fourth lower insulating layer 340L. A fourth lower redistribution via RDL_LV4 may be provided inside the fourth lower insulating layer 340L.

In some embodiments, the fourth lower redistribution via RDL_LV4 may be connected to the first chip pads 111 of the first semiconductor chip 100. The fourth lower redistribution via RDL_LV4 may be connected to the metal pillars 360.

In some embodiments, the first to fourth lower redistribution vias RDL_LV1, RDL_LV2, RDL_LV3 and RDL_LV4 may extend toward the first side 300L_a from the upper sides of the ball pad 390 and the first to third lower redistribution patterns RDL_L1, RDL_L2, and RDL_L3. For example, the first lower redistribution via RDL_LV1 may extend toward the first side 300L_a in the third direction D3 from the upper side of the ball pad 390. The second lower redistribution via RDL_LV2 may extend toward the first side 300L_a in the third direction D3 from the upper side of the first lower redistribution pattern RDL_L1. The third lower redistribution via RDL_LV3 may extend toward the first side 300L_a in the third direction D3 from the upper side of the second lower redistribution pattern RDL_L2. The fourth lower redistribution via RDL_LV4 may extend toward the first side 300L_a in the third direction D3 from the upper side of the third lower redistribution pattern RDL_L3.

In some embodiments, the upper redistribution substrate 300U may be placed directly on the first semiconductor chip 100. The upper redistribution substrate 300U may come into contact with the first semiconductor chip 100. The first upper insulating layer 310U may come into contact with the first semiconductor chip 100.

In some embodiments, the upper redistribution pattern RDL_U may come into contact with the metal pillars 360. Also, the upper redistribution via RDL_UV may extend toward the second semiconductor chip 200 from the upper side of the upper redistribution pattern RDL_U.

In some embodiments, the first portion 361 of each metal pillar 360 may be placed on the second portion 363. That is, the second portion 363 of each metal pillar 360 may be provided between the first portion 361 of each metal pillar 360 and the lower redistribution substrate 300L. The first portion 361 of each metal pillar 360 may be provided between the second portion 363 of each metal pillar 360 and the upper redistribution substrate 300U. The second portion 363 of each metal pillar 360 may come into contact with the fourth redistribution via RDL_LV4. The first portion 361 of each metal pillar 360 may come into contact with the upper redistribution via RDL_UV.

In some embodiments, the upper side of the first semiconductor chip 100 may be coplanar with the upper side of the metal pillar 360. The upper side of the first semiconductor chip 100 may be coplanar with the upper side of the molding film 370. The upper side of the first semiconductor chip 100 is not covered with the molding film 370.

A method for fabricating a semiconductor package according to some embodiments is described below with reference to FIGS. 12 to 20.

FIGS. 12 to 20 are diagrams illustrating a manufacturing process of the semiconductor package having the cross section of FIG. 2.

Figure 12:
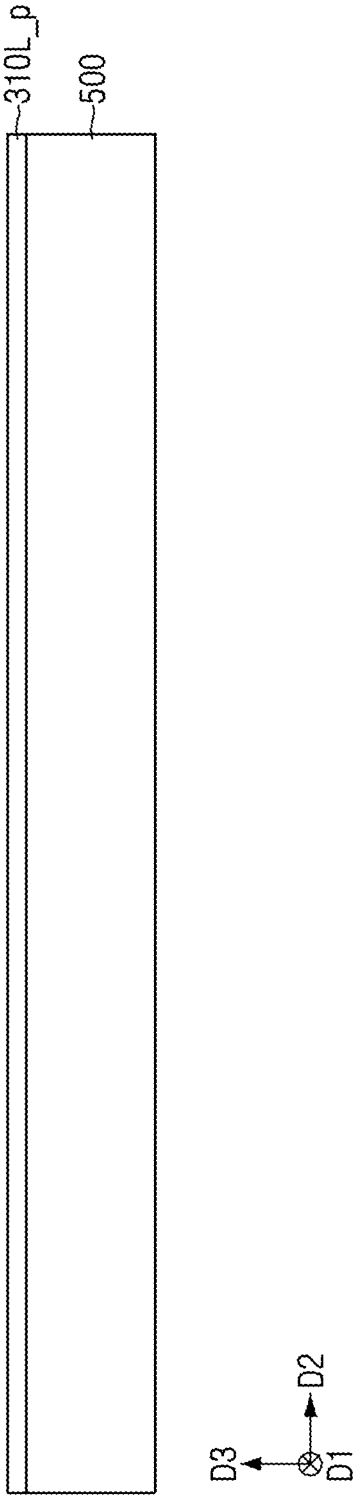
FIGS. 12 to 20 are diagrams illustrating a manufacturing process of the semiconductor package having the cross section of FIG. 2.

Referring to FIG. 12, a carrier substrate 500 may be provided. The carrier substrate 500 may include glass. A pre-first lower insulating layer 310L_p may be formed on the carrier substrate 500.

The pre-first lower insulating layer 310L_p may be made up of a photoimageable dielectric. The pre-first lower insulating layer 310L_p may include, for example, a photosensitive polymer. The photosensitive polymer may be formed of, for example, at least one of photosensitive polyimide, polybenzoxazole, phenolic polymer, and benzocyclobutene-based polymer.

Figure 13:
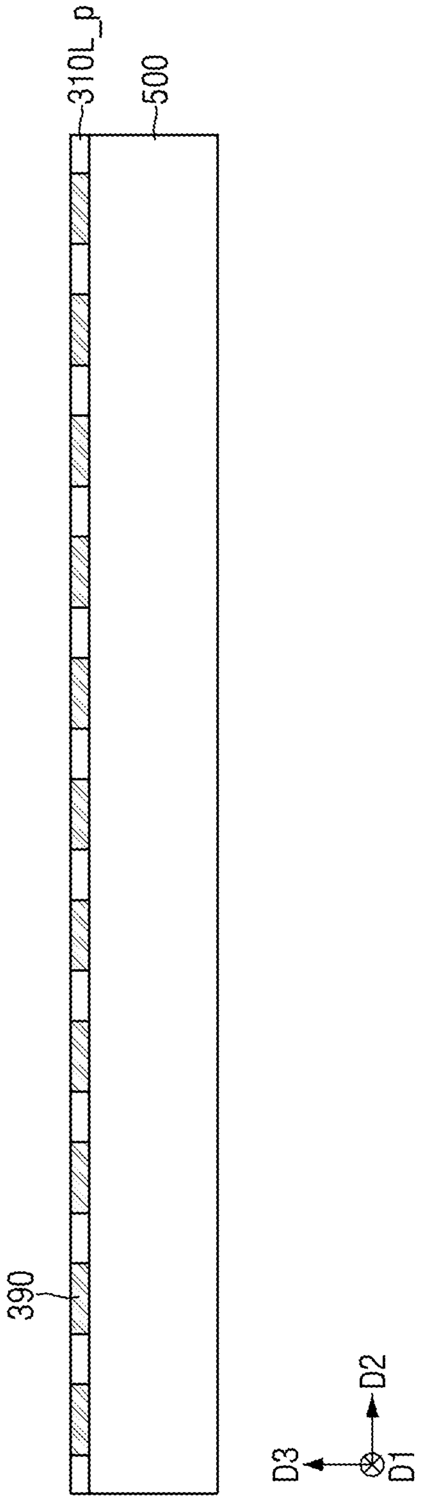

Referring to FIG. 13, a part of the pre-first lower insulating layer 310L_p may be etched. First, although not shown, a mask film may be formed on the pre-first lower insulating layer 310L_p. The mask film may have an opening that approximately defines the positions of the ball pad 390. The mask film may be formed of a photoresist film, ACL (Amorphous Carbon Layer), SOH (Spin on Hardmask) or SOC (Spin on Carbon).

A part of the pre-first lower insulating layer 310L_p may be etched, using the mask film as the etching mask. The pre-lower insulating layer 310L_p is etched to form a recess. A ball pad 390 is formed inside the recess. Although not shown, a pre-metal layer that fills the recess and covers the pre-first lower insulating layer 310L_p may be formed. The pre-metal layer includes copper. The pre-metal layer may be then etched to expose the upper side of the pre-first lower insulating layer 310L_p. The ball pad 390 is formed by etching the pre-metal layer.

Figure 14:
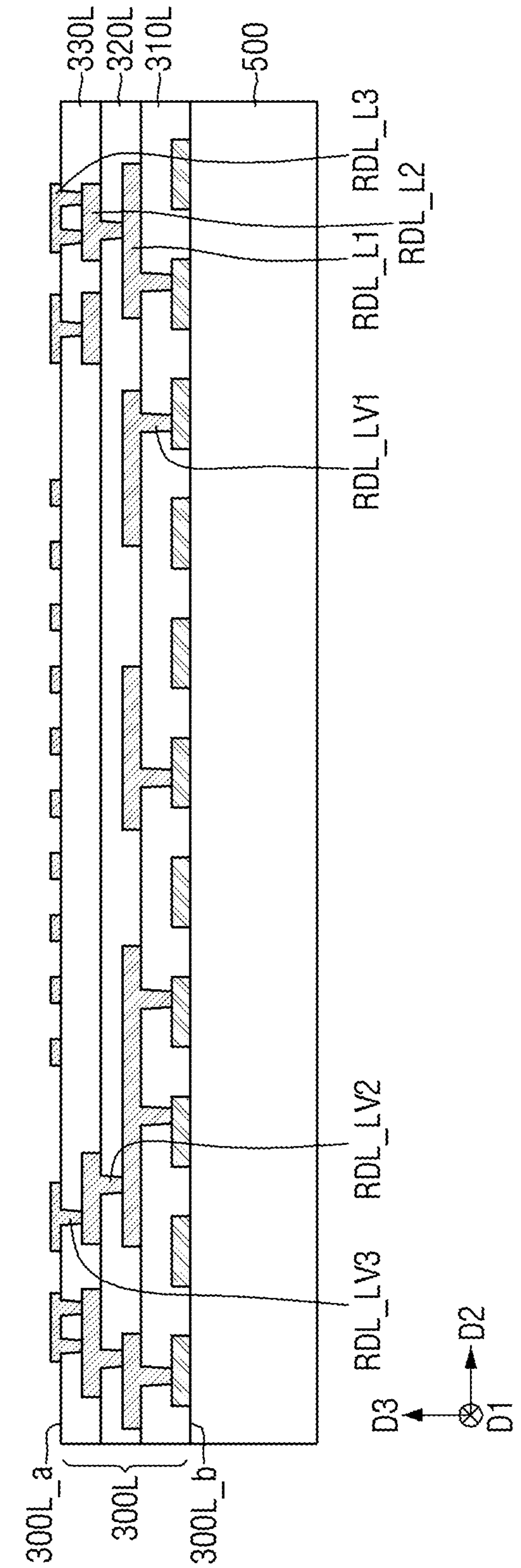

Referring to FIG. 14, a lower redistribution substrate 300L, first to third lower redistribution patterns RDL_L1, RDL_L2 and RDL_L3, and first to third lower redistribution vias RDL_LV1, RDL_LV2 and RDL_LV3 may be formed.

First, a first lower insulating layer 310L may be formed. A first lower redistribution via RDL_LV1 may be formed inside the first lower insulating layer 310L. Subsequently, a second lower insulating layer 320L may be formed. A first lower redistribution pattern RDL_L1 and a second lower redistribution via RDL_LV2 may be formed inside the second lower insulating layer 320L. Subsequently, a third lower insulating layer 330L may be formed. A second lower redistribution pattern RDL_L2 and a third lower redistribution via RDL_LV3 may be formed inside the third lower insulating layer 330L. A third lower redistribution pattern RDL_L3 may be formed on the third lower insulating layer 330L.

The lower redistribution substrate 300L includes first to third lower insulating layers 310L, 320L and 330L. The lower redistribution substrate 300L includes a first side 300L_a and a second side 300L_b that are opposite to each other. The first side 300L_a of the lower redistribution substrate 300L may be an upper side of the third lower insulating layer 330L. The second side 300L_b of the lower redistribution substrate 300L may be a lower side of the first lower insulating layer 310L.

Figure 15:
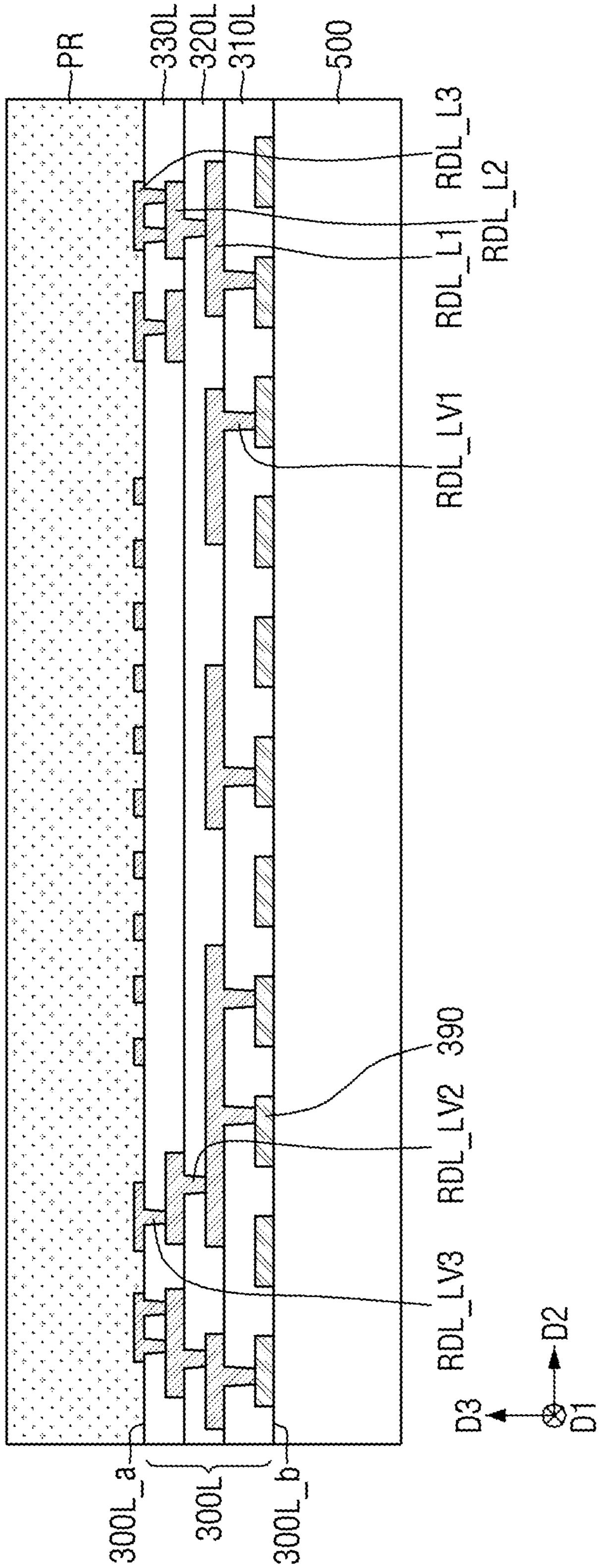

Referring to FIG. 15, a photoresist layer PR may be formed on the first side 300L_a of the lower redistribution substrate 300L. The photoresist layer PR may include chemicals whose properties change in response to light. For example, the photoresist layer PR may include positive photoresist or negative photoresist. The positive photoresist may include chemicals that have properties of dissolving portions exposed to light. The negative photoresist may include chemicals that have the property of dissolving portions not exposed to light.

Figure 16:
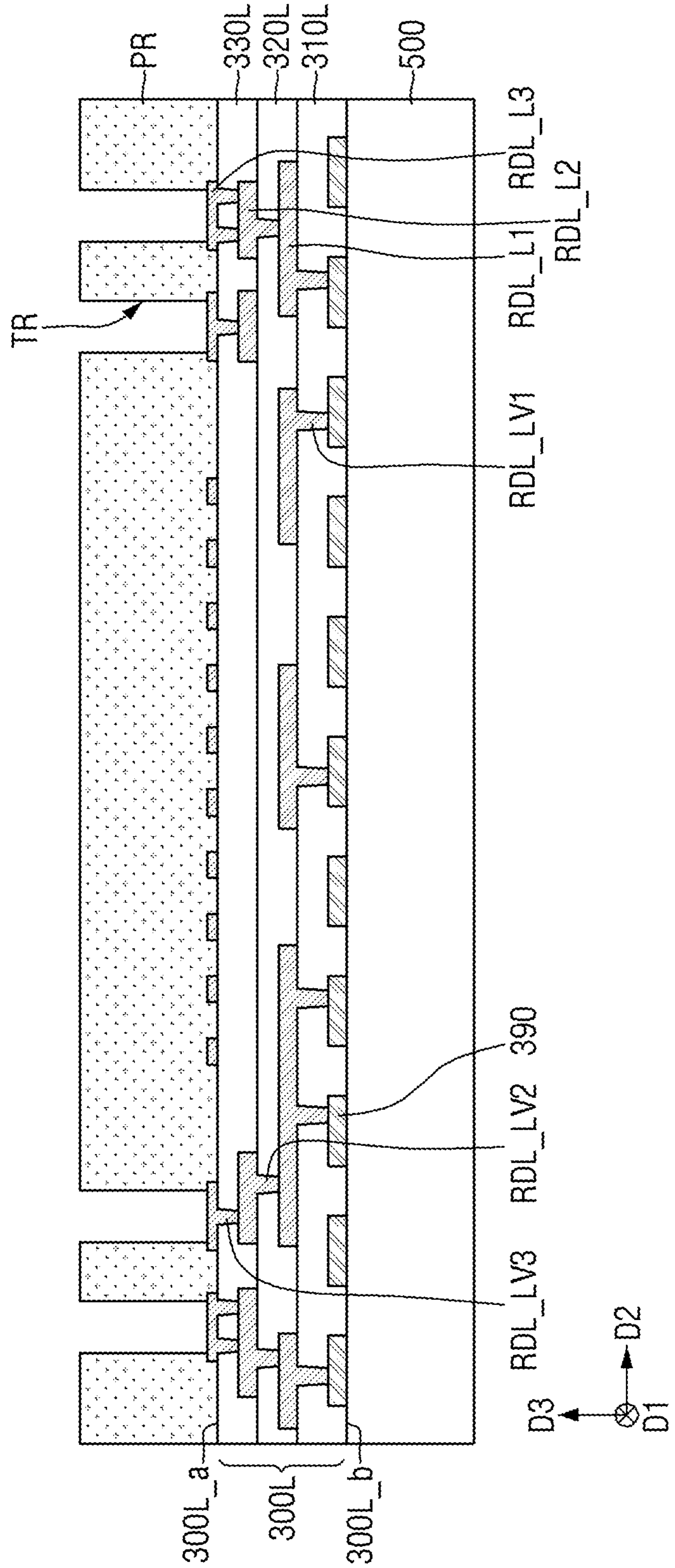

Referring to FIG. 16, a part of the photoresist layer PR may be removed to form the trench TR. The trench TR may expose the third lower redistribution pattern RDL_L3. The shape of trench TR may be, but is not limited to, a cylindrical shape.

Figure 17:
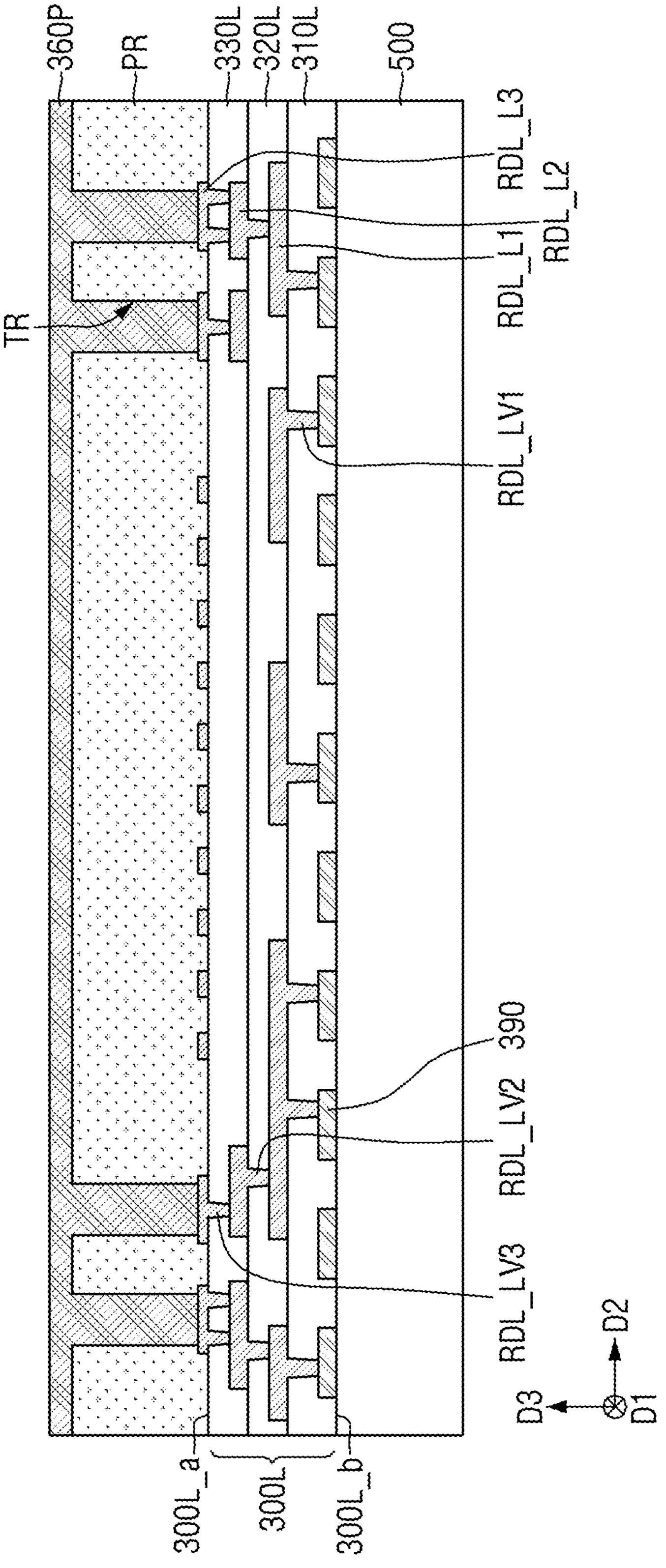

Referring to FIG. 17, a pre-metal pillar 360P that fills the trench TR and covers the photoresist layer PR may be formed. The pre-metal pillars 360P may be formed through electroplating. Accordingly, side walls of the pre-metal pillars 360P inside the trench TR may include protrusions (365 of FIG. 19). The pre-metal pillar 360P may include the same material as the third lower redistribution pattern RDL_L3. The material may include, but is not limited to, copper (Cu), aluminum (Al), silver (Ag), tin (Sn), gold (Au), nickel (Ni), lead (Pb), titanium (Ti) or alloys thereof.

Figure 18:
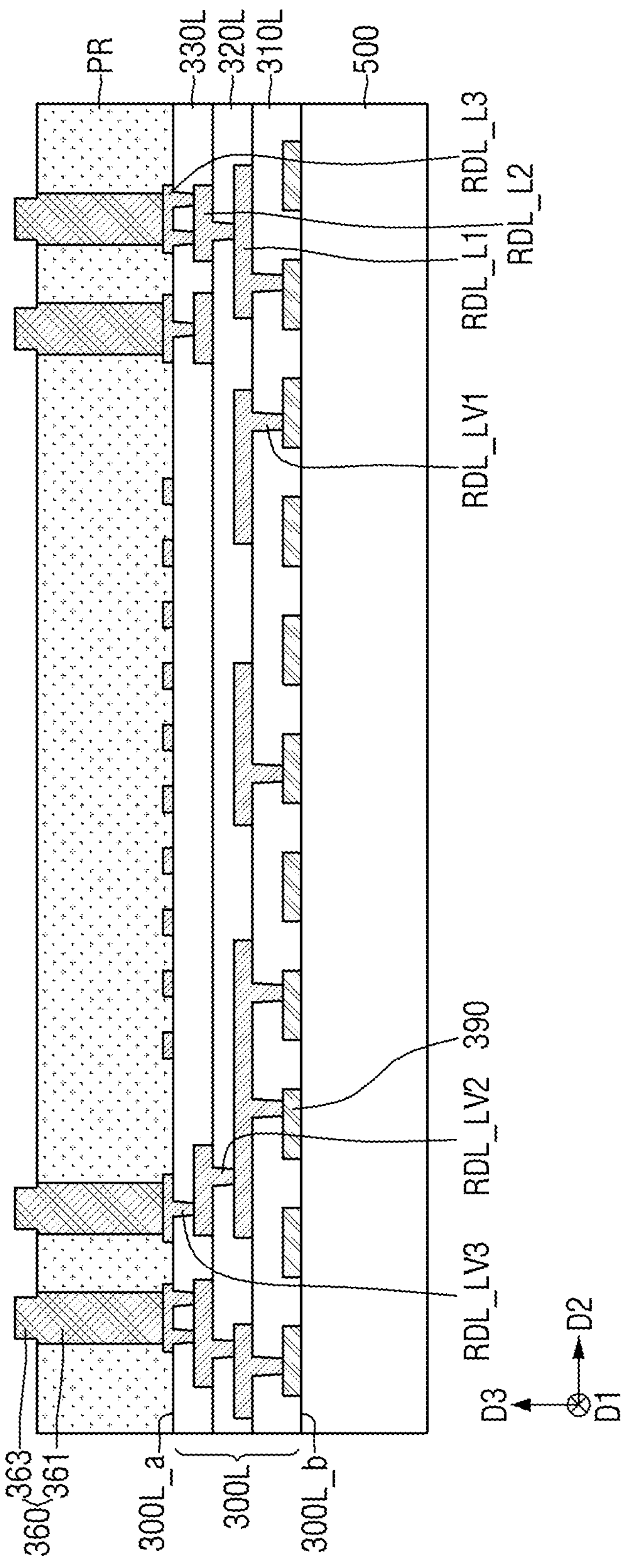

Referring to FIG. 18, a part of the pre-metal pillar 360P may be removed to form a plurality of metal pillars 360. Removal of a part of the pre-metal pillar 360P may utilize laser grooving. A cross-section cut using the laser grooving may be a flat surface.

Figure 19:
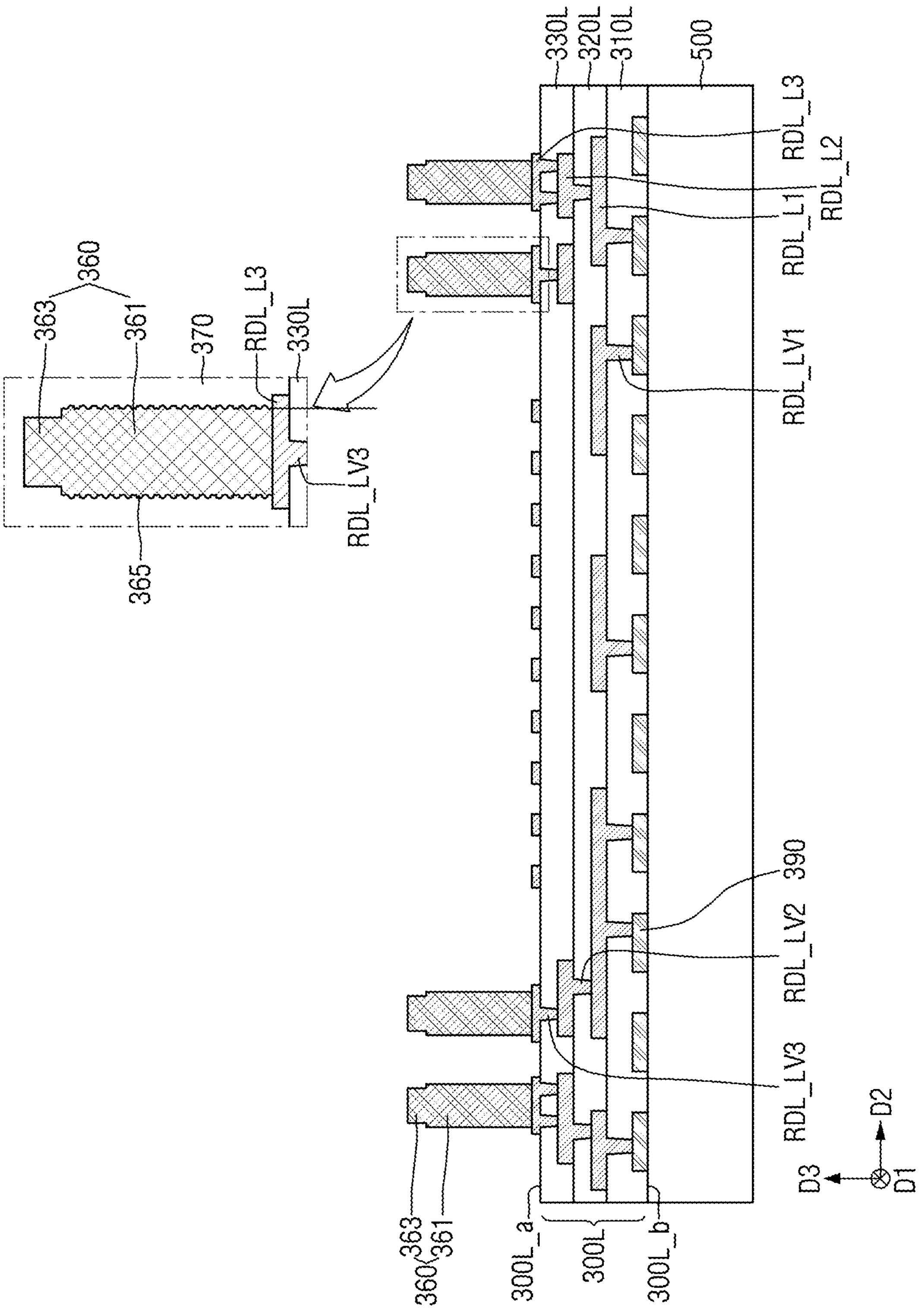

Referring to FIG. 19, the photoresist layer PR may be removed. The photoresist layer PR may be removed to expose side walls of the metal pillar 360.

The metal pillar 360 may include a first portion 361 and a second portion 363. The second portion 363 of the metal pillar 360 may be formed, using the laser grooving. The first portion 361 of the metal pillar 360 may be formed, using the electroplating.

A side wall 361SW of the first portion 361 of the metal pillar 360 may include protrusions 365, and a side wall 363 SW of the second portion 363 of the metal pillar 360 does not include the protrusions. The side walls of the second portion 363 of the metal pillar 360 may be a flat plane.

Figure 20:
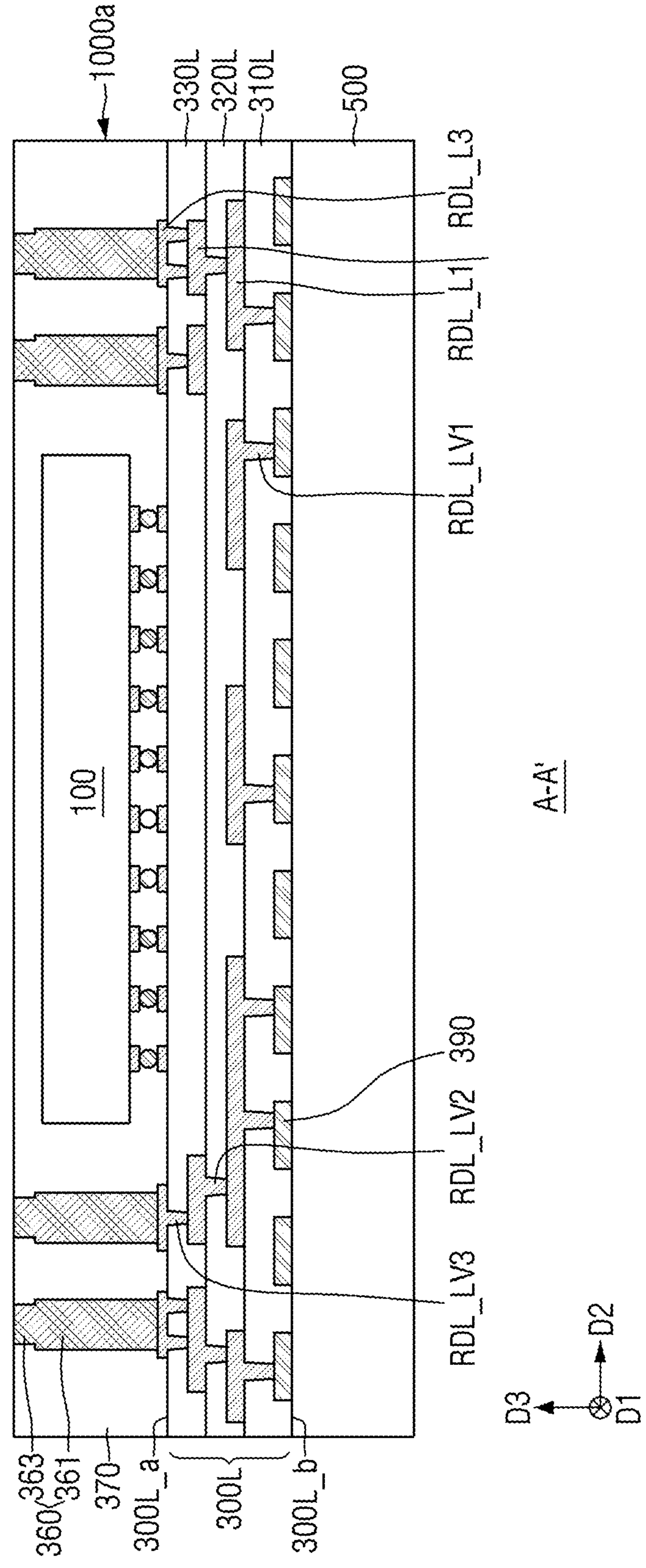

Referring to FIG. 20, the first semiconductor chip 100 may be mounted on the first side 300L_a of the lower redistribution substrate 300L. Subsequently, a molding film 370 that covers the first semiconductor chip 100 may be formed. The molding film 370 may cover the side walls of the metal pillar 360. The upper side of the molding film 370 may be coplanar with the upper side of the metal pillar 360.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A semiconductor package comprising:

a redistribution substrate comprising a first side and an opposite second side;

a plurality of redistribution patterns in the redistribution substrate;

a semiconductor chip on the first side of the redistribution substrate;

a plurality of metal pillars positioned around the semiconductor chip, wherein the plurality of metal pillars are connected to the plurality of redistribution patterns; and a plurality of solder balls on the second side of the redistribution substrate, wherein a monolithic portion of each of the metal pillars includes a third side facing the first side of the redistribution substrate, and an opposite fourth side, wherein the fourth side has a square or octagonal shape in plan view, and the third side has a shape in plan view different than the shape of the fourth side, wherein each of the metal pillars has a height of between 250 μm and 350 μm.

2. The semiconductor package of claim 1, wherein the third side of each metal pillar has a circular shape in plan view.

3. The semiconductor package of claim 1, wherein each of the plurality of metal pillars comprises a first portion, and a second portion, and wherein a side wall of the first portion of each metal pillar comprises protrusions.

4. The semiconductor package of claim 3, wherein a side wall of the second portion of each metal pillar comprises a flat surface.

5. The semiconductor package of claim 3, wherein a height of the first portion of each metal pillar is greater than a height of the second portion of each metal pillar.

6. The semiconductor package of claim 5, wherein a ratio of the height of the first portion of each metal pillar to the height of the second portion of each metal pillar is 5:1.

7. The semiconductor package of claim 3, wherein a width of the first portion of each metal pillar is smaller than a width of the second portion of each metal pillar.

8. The semiconductor package of claim 3, wherein a width of the first portion of each metal pillar is greater than a width of the second portion of each metal pillar.

9. The semiconductor package of claim 1, further comprising:

a plurality of redistribution vias connected to the plurality of redistribution patterns, wherein the plurality of redistribution vias extend toward the second side of the redistribution substrate in a direction from a lower side of the plurality of redistribution patterns.

10. A semiconductor package comprising:

a redistribution substrate comprising a first side and an opposite second side;

a plurality of redistribution patterns in the redistribution substrate;

a semiconductor chip on the first side of the redistribution substrate;

a plurality of metal pillars positioned adjacent to a side surface of the semiconductor chip, wherein the plurality of metal pillars are connected to the plurality of redistribution patterns; and a plurality of solder balls on the second side of the redistribution substrate, wherein each of the metal pillars comprises a first portion, and a second portion, and wherein the first portion of each metal pillar has a cylindrical shape in plan view, and the second portion of each metal pillar has a square shape in plan view, and the first portion and the second portion are formed of a same material, wherein a width of the first portion of each metal pillar is greater than a width of the second portion of each metal pillar.

11. The semiconductor package of claim 10, wherein a side wall of the first portion of each metal pillar comprises protrusions.

12. The semiconductor package of claim 11, wherein a side wall of the second portion of each metal pillar comprises a flat surface.

13. The semiconductor package of claim 10, wherein a height of the first portion of each metal pillar is greater than a height of the second portion of each metal pillar.

14. The semiconductor package of claim 10, wherein each of the metal pillars has a height of between 250 μm and 350 μm.

15. The semiconductor package of claim 10, further comprising:

a plurality of redistribution vias connected to the plurality of redistribution patterns, wherein the plurality of redistribution vias extend toward the second side of the redistribution substrate in a direction from a lower side of the plurality of redistribution patterns.

16. A semiconductor package comprising:

a redistribution substrate comprising a first side and an opposite second side;

a plurality of redistribution patterns in the redistribution substrate and extending in a first direction;

a plurality of redistribution vias connected to the plurality of redistribution patterns, wherein the plurality of redistribution vias extend toward the second side from a lower side of the plurality of redistribution patterns in a second direction transverse to the first direction;

a semiconductor chip on the first side of the redistribution substrate;

a plurality of metal pillars positioned adjacent to a side surface of the semiconductor chip, wherein the plurality of metal pillars are connected to the plurality of redistribution patterns, and wherein each metal pillar includes a first portion, and a second portion; and a plurality of solder balls on the second side of the redistribution substrate, wherein the first portion of each metal pillar has a cylindrical shape, and the second portion of each metal pillar has a square or octagonal cross-section in plan view, wherein the first portion of each metal pillar comprises protrusions extending from a side wall of the cylindrical shape, and a side wall of the second portion of each metal pillar comprises a flat surface, wherein a width of the first portion of each metal pillar is different from a width of the second portion of each metal pillar, and wherein a height of the first portion of each metal pillar is greater than a height of the second portion of each metal pillar.

17. The semiconductor package of claim 16, wherein the second portion of each metal pillar has a square pillar shape in plan view.

18. The semiconductor package of claim 16, wherein each of the metal pillars has a height of between 300 μm and 350 μm.

* * * * *